United States Patent
Ueda et al.

(10) Patent No.: US 8,486,792 B2
(45) Date of Patent: Jul. 16, 2013

(54) FILM FORMING METHOD OF SILICON OXIDE FILM, SILICON OXIDE FILM, SEMICONDUCTOR DEVICE, AND MANUFACTURING METHOD OF SEMICONDUCTOR DEVICE

(75) Inventors: Hirokazu Ueda, Sendai (JP); Yoshinobu Tanaka, Albany, NY (US); Yusuke Ohsawa, Amagasaki (JP); Toshihisa Nozawa, Sendai (JP); Takaaki Matsuoka, Tokyo (JP)

(73) Assignee: Tokyo Electron Limited (JP)

( * ) Notice: Subject to any disclaimer, the term of this patent is extended or adjusted under 35 U.S.C. 154(b) by 248 days.

(21) Appl. No.: 12/992,209

(22) PCT Filed: May 11, 2009

(86) PCT No.: PCT/JP2009/059106
§ 371 (c)(1),
(2), (4) Date: Nov. 11, 2010

(87) PCT Pub. No.: WO2009/139485
PCT Pub. Date: Nov. 19, 2009

(65) Prior Publication Data
US 2011/0074013 A1    Mar. 31, 2011

Related U.S. Application Data

(60) Provisional application No. 61/127,591, filed on May 13, 2008.

(30) Foreign Application Priority Data

Sep. 1, 2008    (JP) .................................. 2008-224162
Feb. 19, 2009   (JP) .................................. 2009-036749

(51) Int. Cl.
H01L 21/336   (2006.01)
H01L 21/76    (2006.01)
H01L 21/302   (2006.01)

(52) U.S. Cl.
USPC ........... 438/296; 438/436; 438/772; 438/788; 257/E21.546; 118/723 AN

(58) Field of Classification Search
USPC ........... 438/296, 436, 772, 788; 257/E21.546
See application file for complete search history.

(56) References Cited

U.S. PATENT DOCUMENTS 5,804,513 A * 9/1998 Sakatani et al. ............... 438/693
2003/0207579 A1* 11/2003 Rattner et al. ................. 438/700
(Continued)

FOREIGN PATENT DOCUMENTS

JP    02-224234    9/1990
JP    09223693     8/1997
(Continued)

OTHER PUBLICATIONS

International Search Report-PCT/JP2009/059106 dated Aug. 18, 2009.
(Continued)

Primary Examiner — Charles Garber
Assistant Examiner — Ron Pompey
(74) Attorney, Agent, or Firm — Cantor Colburn LLP

(57) ABSTRACT

A silicon compound gas, an oxidizing gas, and a rare gas are supplied into a chamber (2) of a plasma processing apparatus (1). A microwave is supplied into the chamber (2), and a silicon oxide film is formed on a target substrate with plasma generated by the microwave. A partial pressure ratio of the rare gas is 10% or more of a total gas pressure of the silicon compound gas, the oxidizing gas, and the rare gas, and an effective flow ratio of the silicon compound gas and the oxidizing gas (oxidizing gas/silicon compound gas) is not less than 3 but not more than 11.

27 Claims, 11 Drawing Sheets

U.S. PATENT DOCUMENTS

| | | | |
|---|---|---|---|
| 2004/0005781 A1* | 1/2004 | Huang et al. | 438/694 |
| 2004/0115897 A1* | 6/2004 | Inoue et al. | 438/424 |
| 2004/0224450 A1* | 11/2004 | Itonaga et al. | 438/197 |
| 2005/0250293 A1* | 11/2005 | Jung | 438/424 |
| 2006/0258098 A1* | 11/2006 | Lee | 438/258 |
| 2007/0105402 A1* | 5/2007 | Goto et al. | 438/795 |
| 2007/0215975 A1* | 9/2007 | Idani et al. | 257/510 |
| 2010/0075066 A1* | 3/2010 | Ueda et al. | 427/575 |
| 2012/0003842 A1* | 1/2012 | Ueda et al. | 438/788 |

FOREIGN PATENT DOCUMENTS

| | | |
|---|---|---|
| JP | 2000021598 | 1/2000 |
| JP | 2004-336019 | 11/2004 |
| JP | 2005-252012 | 9/2005 |
| JP | 2008091176 | 4/2008 |
| JP | 2008-124424 | 5/2008 |
| TW | 200830450 | 7/2008 |
| WO | 2008/047520 | 4/2008 |

OTHER PUBLICATIONS

Korean Office Action—Korean Application No. 10-2010-7023086 issued on Oct. 11, 2011, citing JP 02-224234 and WO 2008/047520.

* cited by examiner

FILM FORMING METHOD OF SILICON OXIDE FILM, SILICON OXIDE FILM, SEMICONDUCTOR DEVICE, AND MANUFACTURING METHOD OF SEMICONDUCTOR DEVICE

TECHNICAL FIELD

The present invention relates to a film forming method of a silicon oxide film, a silicon oxide film, a semiconductor device, and a manufacturing method of a semiconductor device.

BACKGROUND ART

As a method for forming an insulating film such as a silicon oxide film and a nitride film in a transistor element isolation region or an interlayer insulating film between wirings in a semiconductor manufacturing process, a thermal CVD method is usually used to form a high-quality insulating film in the case where a high-temperature heat treatment at 750° C. or more is allowed in the process. In addition, in the case where a high-temperature heat treatment at 450° C. to 750° C. is allowed in the process, a thermal CVD film is formed at a temperature of 420° C. to 500° C. by CVD method at a normal-pressure, and then the quality of the insulating film is improved by a heat treatment at about 750° C. in general.

Recently, it is highly required to operate an element such as an LSI (large-scale integration) and a CCD device at higher speed, and to miniaturize a manufacturing process to implement low power consumption, and to improve the quality of the insulating film such as the silicon oxide film and the nitride film formed in the transistor element isolation region or the interlayer insulating film between the wirings (that is, to improve the electric characteristics shown by withstand voltage and leak current characteristics in general). In general, it is known that a CVD oxide film and a CVD nitride film formed by a film forming method of a low-temperature CVD method where the assist of active oxygen such as plasma and ozone is necessary, is inferior in film quality (electric characteristics here) to a film formed by a HTO-CVD method such as a thermal CVD method, in a process after a gate forming step (BEOL) in a semiconductor element such as an LSI and a CMOS image sensor in which a metal (metal material) having a low melting point (450° C. or less) is used as a gate wiring material of a transistor. In addition, it is known that according to a plasma CVD film formed by a plasma CVD method, the characteristics of a formed transistor deteriorates in a latter process (BEOL) due to damage caused by plasma processing.

A patent literature 1 (PTL 1) discloses a film forming method in which a film with less oxygen deficit can be formed easily at low cost. A mixed gas contains an organic metal compound gas, an oxidizing gas, and a rare gas (inert gas). A proportion Pr of a partial pressure of the rare gas in the mixed gas is $85\% \leq Pr < 100\%$. The mixed gas is introduced in a plasma processing chamber. According to the technique, plasma is generated in the plasma processing chamber, and the organic metal gas and the oxidizing gas are decomposed by the plasma to form a metal oxide film on a target substrate.

A patent literature 2 (PTL 2) discloses a film forming method in which a silicon base oxide film is formed on a target substrate uniformly while preventing plasma damage given to the target substrate or the silicon base oxide film formed on the target substrate. A mixed gas containing an organic silicon compound gas having silicon atoms, carbon atoms, and oxygen atoms in at least one molecule, an oxidizing gas, and a rare gas having at least one kind or more among argon, krypton and xenon in which the proportion, Pr, of the partial pressure of the rare gas becomes $15\% \leq Pr \leq 85\%$ is supplied into a plasma processing chamber. According to the technique, plasma is generated in the plasma processing chamber, and the organic silicon compound gas and the oxidizing gas are decomposed by the plasma to form a silicon oxide film on the target substrate. In addition, as a plasma source, a parallel plate type plasma source is used.

CITATION LIST

Patent Literature

PTL 1: Japanese Unexamined Patent Publication No. 2004-336019
PTL 2: Japanese Unexamined Patent Publication No. 2005-252012

SUMMARY OF INVENTION

Technical Problem

According to the PTL 1, it is described that a preferable film quality can be provided by increasing an amount of the rare gas to increase an electron density in the plasma. Although it is described that xenon (Xe) is most preferable as a rare gas having a high-molecular weight as compared with a rare gas having a low-molecular weight, in order to increase the electron density, the gas is unfit for mass production and unfavorable in view of its used amount and cost. According to the PTL 2, although the silicon base oxide film is uniformly formed, the component of the film quality is not considered.

According to the low-temperature plasma CVD film forming technique in which a silicon oxide film (SiO) is formed at 450° C., despite the various attempts to optimize a film forming condition, and devise an assist method from the plasma and a raw material, the quality of the formed silicon oxide film (As Deposition) is clearly inferior to that of a thermal CVD film formed at 800° C. or more (SiH4 based SiO-CVD film called a HTO) in electrical characteristics (withstand voltage and leak characteristics, for example). In addition, according to the low-temperature plasma CVD film forming technique, as one of its causes, it has been confirmed by analysis of FT-IR (Fourier Transform infrared spectrometer) that impurity components such as Si—OH, Si—H and SiO—$CH_3$ are mixed in the silicon oxide film, and confirmed by analysis of TDS (Thermal Desorption Spectroscopy) for detecting a water amount in the film that hydrogen or water is taken in the film, or an organic impurity is taken therein.

However, the CVD film under high temperature of 700° C. or more cannot be formed in a semiconductor device having a metal wiring. Although an atomic layer deposition (ALD) method for forming a high-quality film at low temperature attracts lots of attention as an alternative technique, since its film forming speed is very low, throughput is lowered when the method is applied to the semiconductor production process, so that the method is not preferable in view of mass production. In addition, according to the plasma CVD film forming with the conventional parallel plate type plasma source, the problem is that plasma charging damage generated while the film is formed promotes the deterioration of LSI element characteristics. Furthermore, when this plasma source is used, since the electron temperature of the generated plasma is as high as several eV (electron volt) to several tens of eV even in the vicinity of the target substrate, the substrate is excessively damaged, and an inner wall of the chamber is sputtered, so that a metal element such as aluminum is taken into the film. Thus, it is difficult to form a film having less defect and less impurities.

The present invention was made in view of the above circumstances, and it is an object to provide a film forming method of a silicon oxide film, a silicon oxide film, a semiconductor device, and a production method of a semiconductor device, in which a thin film composed of silicon oxide having an excellent quality can be formed by a low-temperature CVD method even in a semiconductor device having a metal wiring.

SOLUTION TO PROBLEM

In order to achieve the above object, a film forming method of a silicon oxide film according to a first aspect of the invention includes a step of supplying processing gasses containing a silicon compound gas, an oxidizing gas, and a rare gas, in which a partial pressure ratio of the rare gas is 10% or more of a total gas pressure of the silicon compound gas, the oxidizing gas, and the rare gas, and an effective flow ratio of the silicon compound gas and the oxidizing gas (oxidizing gas/silicon compound gas) is not less than 3 but not more than 11, to a plasma processing chamber; a step of supplying a microwave into the plasma processing chamber; and a step of forming a silicon oxide film on a target substrate with plasma generated by the microwave.

Preferably, the silicon compound gas is a silicon compound gas containing Si—O—R (alkoxide group).

Preferably, the silicon compound gas is a TEOS (tetraethoxysilane) gas.

Still preferably, the silicon compound gas is a silane (silicon hydride) gas having a silicon atom and/or a silicon compound gas containing a silane compound.

Preferably, the oxidizing gas contains an oxygen gas.

Still preferably, the oxidizing gas contains an ozone gas.

Preferably, the plasma is generated by a microwave emitted from a slot antenna.

Preferably, the partial pressure ratio of the rare gas is not less than 20% but not more than 80% of the total gas pressure.

Still preferably, the partial pressure ratio of the rare gas is not less than 40% but not more than 75% of the total gas pressure.

Preferably, the effective flow ratio (oxidizing gas/silicon compound gas) is not less than 4.0 but not more than 6.0.

A film forming method of a silicon oxide film according to a second aspect of the present invention includes a step of supplying processing gasses containing a TEOS (tetraethoxysilane) gas, an oxygen gas, and an Ar (argon) gas, in which a partial pressure ratio of the Ar gas is 20% or more of a total gas pressure of the TEOS gas, the oxygen gas, and the Ar gas, and an effective flow ratio of the TEOS gas and the oxygen gas (oxygen gas/TEOS gas) is not less than 3 but not more than 11, to a plasma processing chamber; a step of supplying a microwave into the plasma processing chamber through a slot; and a step of forming a silicon oxide film on a target substrate with plasma generated by the microwave.

Preferably, the partial pressure ratio of the Ar gas is not less than 40% but not more than 75% of the total gas pressure.

Preferably, the effective flow ratio (oxygen gas/TEOS gas) is not less than 4.0 but not more than 6.0.

Preferably, a temperature of the target substrate is set to be not more than 450° C.

Still preferably, a temperature of the target substrate is set to be not less than 360° C. but not more than 390° C.

Preferably, a pressure in the plasma processing chamber is set to be not less than 6.67 Pa but not more than 133.32 Pa.

A silicon oxide film according to a third aspect of the present invention is formed by the film forming method according to the first or second aspect of the present invention.

A silicon oxide film according to a fourth aspect of the present invention serves as a thin film and formed on a target substrate including a metal wiring, with plasma generated by a microwave supplied through a slot, in which impurity components (Si—OH, Si—H and SiO—CH$_3$) are not contained in the thin film substantially.

A silicon oxide film according to a fifth aspect of the present invention is formed with microwave excited plasma, in which a leak current density is not more than $1.0 \times 10^{-7}$ A/cm$^2$ when a negative potential is applied to the silicon oxide film formed on a P-type substrate and having an EOT (equivalent oxide film thickness) of 7 nm±1 nm, and an electric field of 1 MV/cm is applied thereto.

Preferably, impurity components (Si—OH, Si—H and SiO—CH$_3$) are not contained in the silicon oxide film substantially.

A silicon oxide film according to a sixth aspect of the present invention serves as a silicon oxide film (SixOy) formed with microwave excited plasma, in which a variation amount of a composition ratio (x/y) in a film thickness direction is not more than ±3%.

Preferably, a variation amount of the composition ratio (x/y) in the film thickness direction is not more than ±1%.

A semiconductor device according to a seventh aspect of the present invention includes the silicon oxide film according to any one of the third to sixth aspects of the present invention.

A semiconductor device according to an eighth aspect of the present invention has a metal material containing a low melting point metal that is changed in composition due to a heat treatment at 450° C. or more on a target substrate, and includes the silicon oxide film according to any one of the third to sixth aspects of the present invention.

Preferably, the metal material is Cu (copper) or Al (aluminum).

A manufacturing method of a semiconductor device according to a ninth aspect of the present invention includes a step of forming the silicon oxide film according to any one of the third to sixth aspects of the present invention.

In addition, according to another aspect of the present invention, a film formed of a silicon compound at low temperature can be applied to a liner film formed in an element isolation region (STI: Shallow Trench Isolation). Here, a film forming method of a liner film in an element isolation region includes a step of supplying processing gasses containing a silicon compound gas, an oxidizing gas, and a rare gas, in which a partial pressure ratio of the rare gas is 10% or more of a total gas pressure of the silicon compound gas, the oxidizing gas, and the rare gas, and an effective flow ratio of the silicon compound gas and the oxidizing gas (oxidizing gas/silicon compound gas) is not less than 3 but not more than 11, to a plasma processing chamber; and a step of forming a liner film composed of a silicon oxide film on a surface of a trench with plasma generated by a microwave supplied into the plasma processing chamber under the condition that a target substrate in which the trench is formed is set to be not more than 450° C.

Preferably, the method includes a step of performing plasma processing on the surface of the trench, for the target substrate in which the trench is formed before the step of forming the liner film.

In addition, the method includes a step of performing plasma processing on the surface of the liner film after the step of forming the liner film.

As a still preferable embodiment, the silicon compound gas contains a TEOS gas.

As a still preferable embodiment, the oxidizing gas contains an oxygen gas.

As a still preferable embodiment, the rare gas contains an argon gas.

In addition, a film forming method of a liner film in an element isolation region includes a step of supplying processing gasses containing a silicon compound gas, an oxidizing gas, and a rare gas, in which a partial pressure ratio of the rare gas is 10% or more of a total gas pressure of the silicon compound gas, the oxidizing gas, and the rare gas, and an effective flow ratio of the silicon compound gas and the oxidizing gas (oxidizing gas/silicon compound gas) is not less than 3 but not more than 11, to a plasma processing chamber; a step of forming a liner film composed of a silicon oxide film on a surface of a trench with plasma generated by a microwave supplied into the plasma processing chamber under the condition that a target substrate in which the trench is formed is set to be not more than 300° C.; and a step of performing plasma processing on the surface of the liner film after the step of forming the liner film.

Preferably, the method includes a step of performing plasma processing on the surface of the trench, for the target substrate in which the trench is formed before the step of forming the liner film.

According to still another aspect of the present invention, a production method of a semiconductor device includes a step of forming an element on a target substrate; and a step of forming a liner film by one of the above-described film forming methods of the liner film after the step of forming the element.

ADVANTAGEOUS EFFECTS OF INVENTION

According to the film forming method of the silicon oxide film, the silicon oxide film, the semiconductor device, and the production method of the semiconductor device in the present invention, a thin film composed of a silicon oxide having an excellent quality can be formed by a low-temperature CVD method even in a semiconductor device having a metal wiring (a part formed of metal such as a metal gate may be contained).

BRIEF DESCRIPTION OF DRAWINGS

FIG. 13 is a sectional view showing a semiconductor device according to a second embodiment of the present invention, in which FIG. 13A to 13D show production steps;

EXPLANATION OF REFERENCES

1 PLASMA PROCESSING APPARATUS
2 CHAMBER
3 TOP PLATE (DIELECTRIC WINDOW)
4 ANTENNA
5 WAVEGUIDE
7 COOLING JACKET
30 MOSCAP ELEMENT
50 SILICON SUBSTRATE
53 GATE INSULATION FILM
W TARGET SUBSTRATE

DESCRIPTION OF EMBODIMENTS (First Embodiment)

Figure 1:
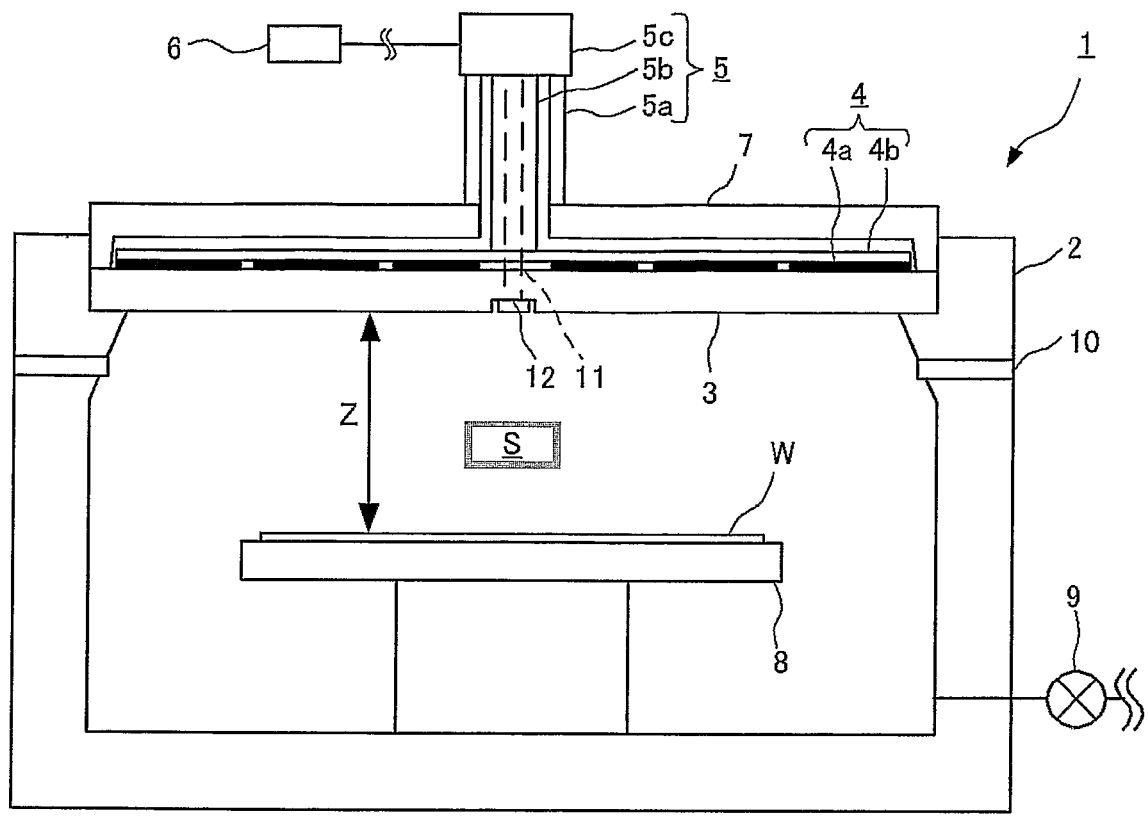
FIG. 1 is a sectional view showing a plasma processing apparatus according to a first embodiment of the present invention.
Figure 2:
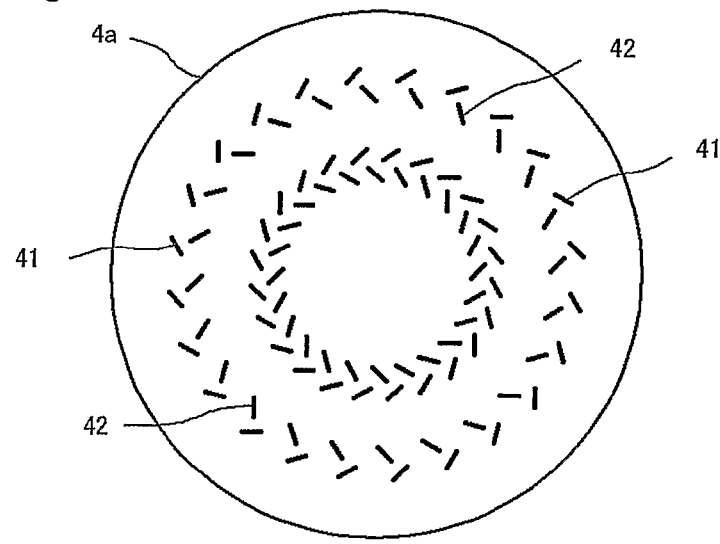
FIG. 2 is a plan view showing one example of a slot plate.

FIG. 1 is a sectional view showing a plasma processing apparatus according to a first embodiment of the present invention. The plasma processing apparatus is a plasma processing apparatus in which a silicon oxide film is formed on a target substrate with plasma generated by Radial Line Slot Antenna (RLSA). FIG. 2 is a plan view showing one example of a slot plate serving as a part of the plasma processing apparatus.

A plasma processing apparatus 1 includes a chamber 2, a top plate (dielectric window) 3, an antenna 4, a waveguide 5, a microwave source 6, a cooling jacket 7, a substrate holder 8, and a vacuum pump 9. Gas can be supplied from a gas supply source (not shown) into the chamber 2 through a wall gas passage 10 or a center gas passage 11.

The antenna 4 is provided on the top plate 3, and the cooling jacket 7 having a passage for passing a temperature adjustment medium is provided on the antenna 4. The antenna 4 includes a slot plate 4a and a wave length shortening plate (dielectric plate) 4b. The wave length shortening plate 4b is formed of a dielectric material such as $SiO_2$ or $Al_2O_3$, and arranged between the cooling jacket 7 and the slot plate 4a to compress the wavelength of a microwave.

The microwave supplied from the waveguide 5 becomes a standing wave in the wave length shortening plate 4b of the antenna 4. In addition, the wavelength in the wave length shortening plate 4b is shortened to the square root of the ratio of dielectric constants (dielectric constant of waveguide atmosphere/dielectric constant of a dielectric), as compared with the wavelength in the waveguide 5. For example, when the microwave is generated by 2.45 GHz, the wavelength in the dielectric (alumina) is about 4 cm while the wavelength in the waveguide is about 12.2 cm.

The slot plate shown in FIG. 2 is one example of a RLSA (radial line slot antenna). The slot plate 4a is provided by plating a copper plate with gold and the like and has a plurality of slots 41 and 42 to pass the microwave. The plasma can be enlarged by providing the slot plate 4a adjacent to the wave length shortening plate 4b. The microwave is emitted downward from the slots 41 and 42, and transmitted in a radial direction, reflected in the top plate 3 repeatedly, interacting with each other to be intensified, and reinforced, whereby the standing wave is formed. As shown in the drawing, the slots 41 and 42 are formed concentrically such that they cross at right angles. The plasma is spread in a direction vertical to the length directions of the slots 41 and 42, and generated just under the top plate 3. An electron temperature of the excited plasma is highest just under the top plate 3 serving as the dielectric window, and lowered with distance from the top plate 3. A region just under the top plate 3 is at about several eV to several tens of eV and called a plasma excitation region. A region in the vicinity of a target substrate W is about 1.5 eV or less although it depends on the power of the microwave and the like. This region is called a plasma diffusion region.

The plasma generated by the RLSA (radial line slot antenna) features a high density. The density is $10^{13}$ $cm^{-3}$ in the plasma excitation region just under the top plate 3, and it is still as high as $10^{11}$ $cm^{-3}$ in the vicinity of the target substrate W in the plasma diffusion region. According to this embodiment, since the gas is sufficiently dissociated in the region having a high electron temperature, and the film is formed in the plasma diffusion region having a low electron temperature, a high-quality and less-damaged film can be formed on the target substrate W.

The waveguide 5 is connected to the antenna 4. The waveguide 5 includes a shaft tube part consisting of an outer conductor 5a and an inner conductor 5b, and a rectangular waveguide part 5c positioned at the upper part of the shaft tube. The slot plate 4a of the antenna 4 is coupled to the inner conductor 5b, and the center gas passage 11 passes through the center of the inner conductor 5b. The gas is introduced from the gas supply source, and the gas can be supplied from a gas nozzle 12 positioned in the center of top plate 3 into the chamber 2.

A method for forming a silicon oxide film will be described with reference to the plasma processing apparatus 1 hereinafter. The target substrate W is set on the substrate holder 8. Here, a distance Z between the substrate holder 8 and lower surface of the top plate 3 is 135 mm in a space S in which the plasma is formed, and microwave power is 3.5 kW. The target substrate W is 300 mm in diameter.

Although it is not shown, the substrate holder 8 has a heating means such as a heater or a lamp annealing mechanism, so that the target substrate W can be kept at a predetermined temperature, and the temperature is set based on a film forming condition. For example, when the target substrate W is provided with a metal wiring (the metal wiring may contain a part formed of metal such as a metal gate), the temperature is set at 450° C. or less.

The chamber 2 of the plasma processing apparatus 1 is sealed with the top plate 3, and is evacuable (to be pressure reduced state) by the vacuum pump 9. For example, the pressure in the chamber 2 is set to be not more than a predetermined pressure of 133.32 Pa in which particles are not likely to be generated.

The antenna 4 is connected to the upper part of the top plate 3. The waveguide 5 is connected to the antenna 4. More specifically, the slot plate 4a is connected to the inner conductor 5b. The wave length shortening plate 4b is arranged between the cooling jacket 7 and the slot plate 4a to compress the wavelength of the microwave.

The microwave is supplied from the microwave source 6 of 2.45 GHz through the waveguide 5. The microwave is transmitted in a radial direction of the antenna 4 through the wave length shortening plate 4b and emitted from the slots of the slot plate 4a. The microwave is transmitted along the top plate 3 and spread in the entire top plate 3 and supplied to the chamber 2.

The gas is supplied from the gas supply source into the chamber 2 through the wall gas passage 10 and the center gas passage 11. The gas is uniformly discharged from the wall gas passage 10 provided so as to surround the side of the top plate, into the chamber 2. In addition, since the gas is discharged from the gas nozzle 12 toward the center just under the top plate 3, the gas is uniformly supplied to the part just under the whole top plate 3. At this time, a rare gas such as an argon (Ar) gas, an oxidizing gas such as an oxygen gas, and a silicon compound gas are supplied. The silicon compound gas is a TEOS (tetraethoxysilane) gas, for example. Each gas is supplied at a certain partial pressure ratio and flow ratio.

The rare gas for exciting the plasma is excited to provide the plasma, the silicon compound gas is dissociated to be radical. The silicon oxide film is deposited on the target substrate W set on the substrate holder 8, and processed by plasma CVD (Chemical Vapor Deposition). Although the microwave is supplied and then the gases are supplied as shown in this embodiment, the gasses and the microwave may be supplied in reverse order based on the processing condition. Thus, by repeating the series of operations in which the target substrate W is carried into and carried out from the plasma processing apparatus (chamber 2) after the plasma processing, the silicon oxide films are formed on the predetermined number of substrates.

By adjusting a film forming speed within a range of 5 to 600 nm/min, a film thickness can be controlled optionally within a range from as thin as 10 nm to as thick as 1 μm. By changing a time for performing the plasma processing, or a flow ratio of a raw material gas, the thickness of the formed CVD film can be controlled.

Figure 3:
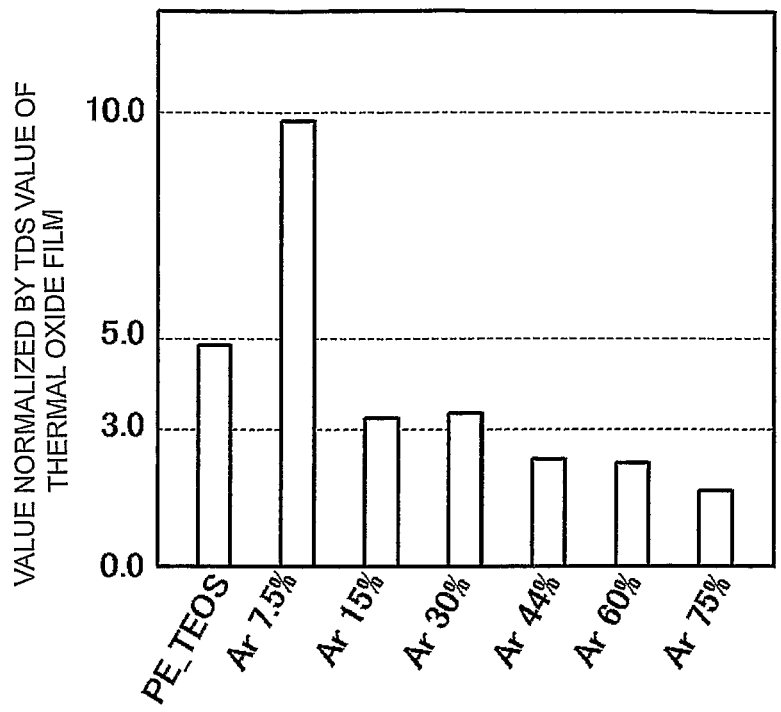
FIG. 3 is a view showing characteristics of a silicon oxide film according to the first embodiment of the present invention and showing a result of TDS when a partial pressure ratio of a rare gas is changed.

FIG. 3 shows a result of TDS (Thermal Disorption Spectroscopy) while the partial pressure ratio of the rare gas (Ar) is changed. Here, the Ar partial pressure ratio is variable, a processing pressure is 50.5 Pa, and a stage temperature is 390° C. Values normalized by the TDS values of a thermal oxide film are plotted on a vertical axis of FIG. 3. A film designated by PE_TEOS and formed by the conventional plasma CVD method is shown for comparison.

According to the result, when the partial pressure is 7.5%, the TDS value is large. When the partial pressure is at least 15% to 75%, the TDS value is small, so that it is known that water, that is, —H and —OH groups are not contained in the film.

Here, as a standard of a film for practical use, the value of about 3, normalized by TDS value of the thermal oxide film may be enough so the partial pressure ratio of the rare gas is to be 10% or greater of a total gas pressure of the rare gas, the oxidizing gas, and the silicon compound gas, when calculated based on the standard value. More preferably, the partial pressure ratio of the rare gas is to be not less than 40% but not more than 75%. When the partial pressure ratio of the rare gas is not less than 40%, the film can be formed in a more preferable condition. Since the rare gas is expensive, the partial pressure ratio of the rare gas is to be set in view of a balance between the quality and manufacturing cost of the film.

Figure 4:
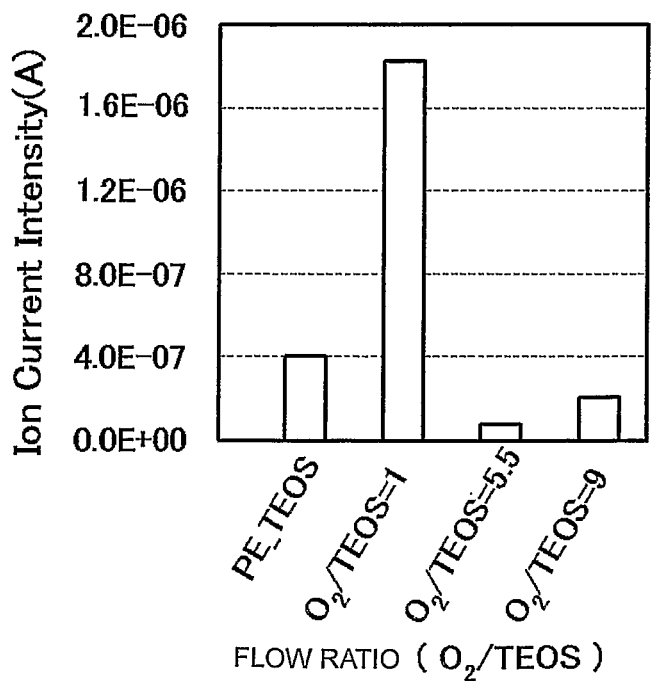
FIG. 4 is a view showing characteristics of the silicon oxide film according to the first embodiment of the present invention and showing a result of TDS when a flow ratio of an oxidizing gas and a silicon compound gas is changed.

FIG. 4 shows the result of TDS while the flow ratio of the oxygen gas and the silicon compound gas is changed variously. Here, the Ar partial pressure ratio is 44%, the processing pressure is 50.5 Pa, and the substrate processing temperature is 390° C.

According to the result, when the flow ratio of the oxygen gas and the silicon compound gas (oxygen gas/silicon compound gas) is around 1, the greater TDS value is shown. Meanwhile, when the flow ratio of the oxygen gas and the silicon compound gas (oxygen gas/silicon compound gas) is about 4 to 9, since the TDS result shows a low value, it can be said that water, that is, —H and —OH groups are essentially not contained in the film. When the flow ratio of the oxygen gas and the silicon compound gas (oxygen gas/silicon compound gas) is not less than 4.0 but not more than 6.0, a sufficiently practical film can be formed.

Figure 5:
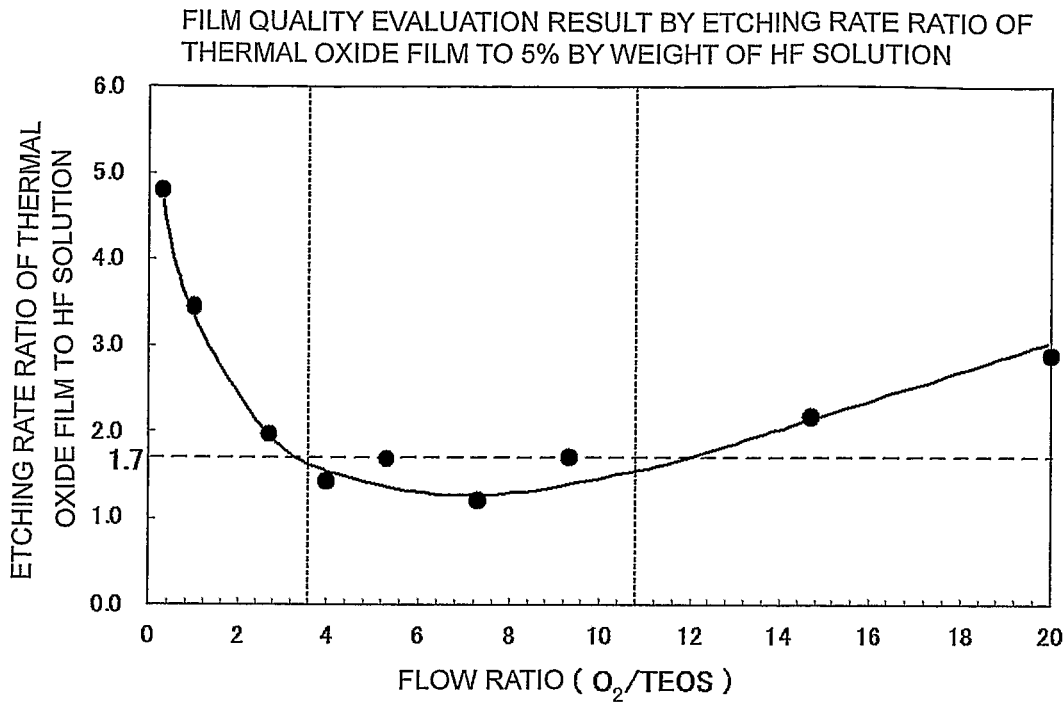
FIG. 5 is a view showing characteristics of the silicon oxide film according to the first embodiment of the present invention and showing a result normalized by an etching rate.

FIG. 5 shows the result provided such that an etching rate of the oxidized silicon film (silicon oxide film) formed by RLSA plasma to 5% by weight of hydrofluoric acid (HF) is normalized by an etching rate of the thermal oxide film to 5% by weight of hydrofluoric acid. Since the etching rate of the CVD oxide film formed at high temperature to a hydrofluoric acid is about two times as high as the etching rate of the thermally oxidized film, the film can be regarded as a good film, when the etching rate is about 1.7 with respect to the etching rate of the thermal oxide film. Thus, the flow ratio of the oxygen gas and the silicon compound gas calculated based on the normalized rate, 1.7, is not less than 3.6 but not more than 10.8. The flow ratio of the oxygen gas and the silicon compound gas is more preferably not less than 4.0 but not more than 6.0, in terms of the ease of the film forming and the film quality.

Figure 6:
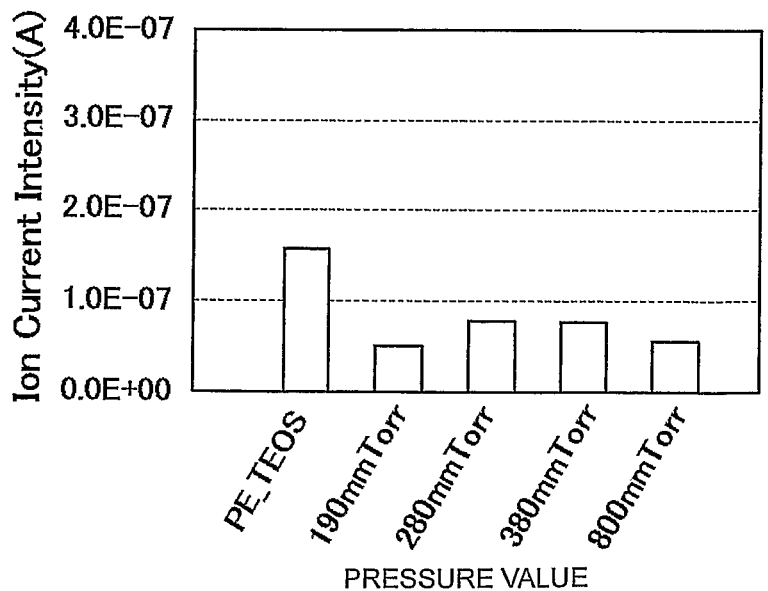
FIG. 6 is a view showing characteristics of the silicon oxide film according to the first embodiment of the present invention and showing a result of TDS when a processing pressure is changed.

FIG. 6 shows the result of the TDS while the processing pressure is changed variously under the condition that the Ar partial pressure ratio is 44%, the oxygen/TEOS flow ratio is 5.5, and the substrate temperature is 390° C. The TDS values show preferable values with respect to all the processing pressures under which the films are formed.

Figure 7:
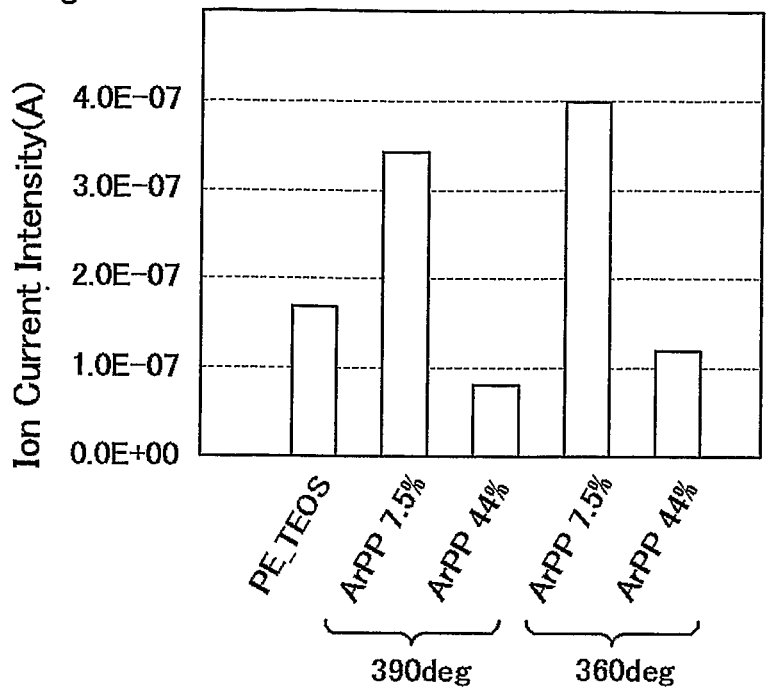
FIG. 7 is a view showing characteristics of the silicon oxide film according to the first embodiment of the present invention and showing a result of TDS when a temperature of a target substrate is changed.

FIG. 7 shows the result of TDS while the temperature of the target substrate is changed variously under the condition that the Ar partial pressure ratio is 44% and 7.5%, the oxygen/TEOS flow ratio is 5.5, and the processing pressure is 50.5 Pa. The film PE_TEOS formed by the conventional plasma CVD is shown for comparison. When the temperatures of the target substrate (substrate holder) are 360° C. and 390° C. while the Ar partial pressure ratio is 7.5%, the TDS value shows a large value. Meanwhile, when the temperatures of the target substrate (substrate holder) are 360° C. and 390° C. while the Ar partial pressure ratio is 44%, the TDS value shows a preferable small value. Thus, it is understood that when the partial pressure ratio of Ar has a preferable value, the target substrate temperature can be widely set. According to the film forming using TEOS gas, there is not a big difference in the TDS of the formed silicon oxide film when the Ar partial pressure ratio is fixed. In this case, when the target substrate temperature is increased, the TDS value shows a smaller value, whereby the preferable film can be provided.

The rare gas may be a xenon (Xe) gas or a krypton (Kr) gas other than the argon (Ar) gas. In addition, the oxidizing gas may be an ozone gas or a carbon monoxide gas as a gas containing an oxygen element other than the oxygen gas. At this time, the number of the oxygen atoms supplied into the chamber is set to be a predetermined value in relation to the number of Si atoms. An effective flow ratio (oxidizing gas/silicon compound gas) will be shown below.

An effective flow rate of the oxidizing gas is given by the following formula (formula 1).

(Flow rate of oxidizing gas)×(number of oxygen atoms contained in one molecule of oxidizing gas)/2  (formula 1)

An effective flow rate of the silicon compound gas is given by the following formula (formula 2).

(Flow rate of silicon compound gas)×(number of Si atoms contained in one molecule of silicon compound gas)  (formula 2)

The effective flow ratio is given by a formula (formula 3) provided by dividing the (formula 1) by the (formula 2).

((Flow rate of oxidizing gas)×(number of oxygen atoms contained in one molecule of oxidizing gas)/2)/(flow rate of silicon compound gas)× (number of Si atoms contained in one molecule of silicon compound gas)  (formula 3)

In the case where the ozone gas is used as the oxidizing gas, for example, when the flow rate of the silicon compound is constant, since the effective flow rate of the ozone gas is 1.5 times as high as the effective flow rate of the oxygen gas, the preferable flow rate is two-thirds times as high as that of the oxygen gas in order to obtain the predetermined effective flow ratio.

Working Example

The characteristics of the silicon oxide film formed by the method according to the first embodiment are evaluated as follows.

Figure 8:
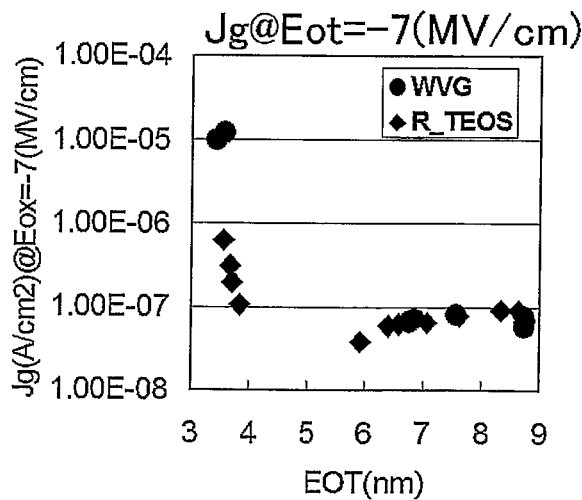
FIG. 8 is a view showing characteristics of the silicon oxide film according to the first embodiment of the present invention and showing leak and withstand voltage characteristics.

FIG. 8 shows current characteristics (J) in a film thickness region of 7 nm±1 nm in terms of EOT (Equivalent Oxide Thickness) while the intensity of the applied electric field is changed. The density of a current flowing in the film when an electric field of 7 MV/cm is applied is measured. Here the target substrate W is a P-type semiconductor.

Figure 9:
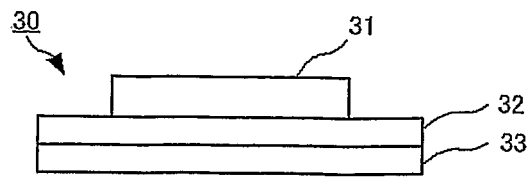
FIG. 9 is a sectional view showing one example of a MOS-CAP element.

The reference character R_TEOS in the drawing designates the silicon oxide film according to the present invention, and a WVG film is shown for comparison. As the element for measuring the electric characteristics, a MOSCAP element used when the electric characteristics are measured in general is formed, and the current-voltage (I-V) characteristics are measured. A MOSCAP element 30 is shown in FIG. 9.

The MOSCAP element 30 is composed of a diffusion layer 31 of an N-type semiconductor, a gate oxide film 32, and a P-type silicon substrate 33.

In FIG. 8, the measurement is made with samples of 3 nm, 6 nm, and 8 nm formed under the condition that the Ar partial pressure is 43-75%, the pressure is 50.5 Pa, the microwave power is 3.5 kW. While all the samples having the above film thicknesses show preferable leak characteristics as compared with the WVG film, the samples of 6 nm and 8 nm show $J<1.0\times10^{-7}$ A/cm$^2$ when an electric field of 7 MV/cm is applied.

According to the results shown in FIGS. 3 to 8, it can be understood that the silicon oxide film formed by the present invention may have the same quality as the WVG thermal oxide film or better regarding withstand voltage and leak characteristics. In addition, it can be also seen that the leak hardly occurs even at a region thinner than 7 nm. Since high leak characteristics are provided regardless of the thickness, it can be accepted in a semiconductor device in which high insulation is required. This is the evaluation result provided in the case where the substrate in the MOS structure is the P type and the negative voltage is applied to the gate, and provided in a harsh environment as compared with an evaluation result provided in its opposite case implemented in general, that is, in the case where the substrate is the N type and the positive voltage is applied to the gate.

Figure 10:
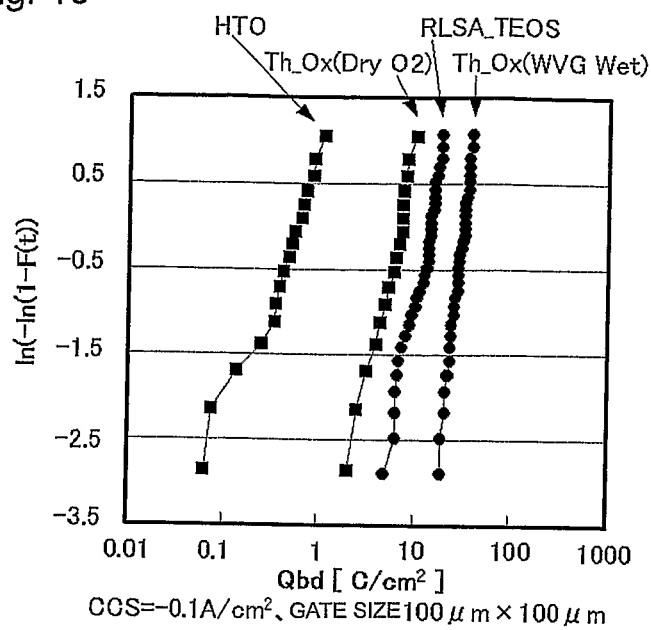
FIG. 10 is a view showing characteristics of the silicon oxide film according to the first embodiment of the present invention, in which Qbd is Weibull plotted.

FIG. 10 shows a measurement result of Qbd (C/cm$^2$) (CCS; −0.1 A/cm$^2$, gate size 100 μm×100 μm) by Weibull plot. The oxide film according to the present invention is shown by R_TEOS. As comparison films, a HTO film, a thermal oxide film, and a WVG film are shown. The obtain Qbd is better than that of the thermal oxide film (Dry-O$_2$ method) and better than that of the HTO film by about two digits. Thus, it is shown that the film formed by the present invention has excellent leak characteristics.

Figure 11A:
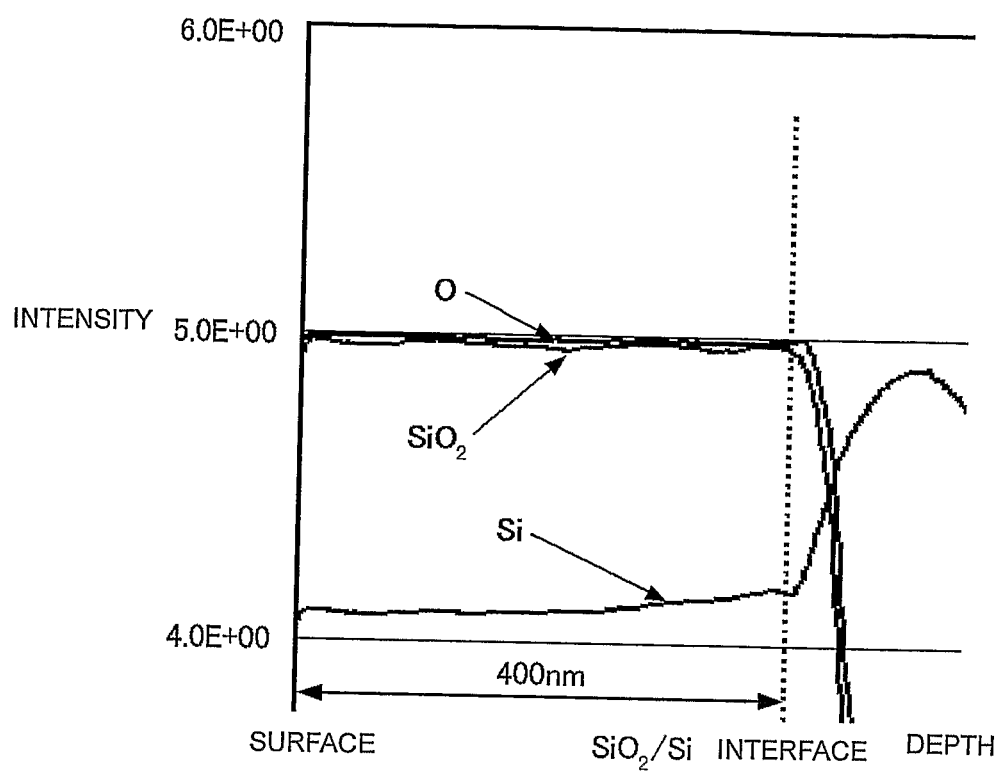
FIG. 11A is a view showing characteristics of the silicon oxide film according to the first embodiment of the present invention and showing a composition ratio of a film quality.
Figure 11B:
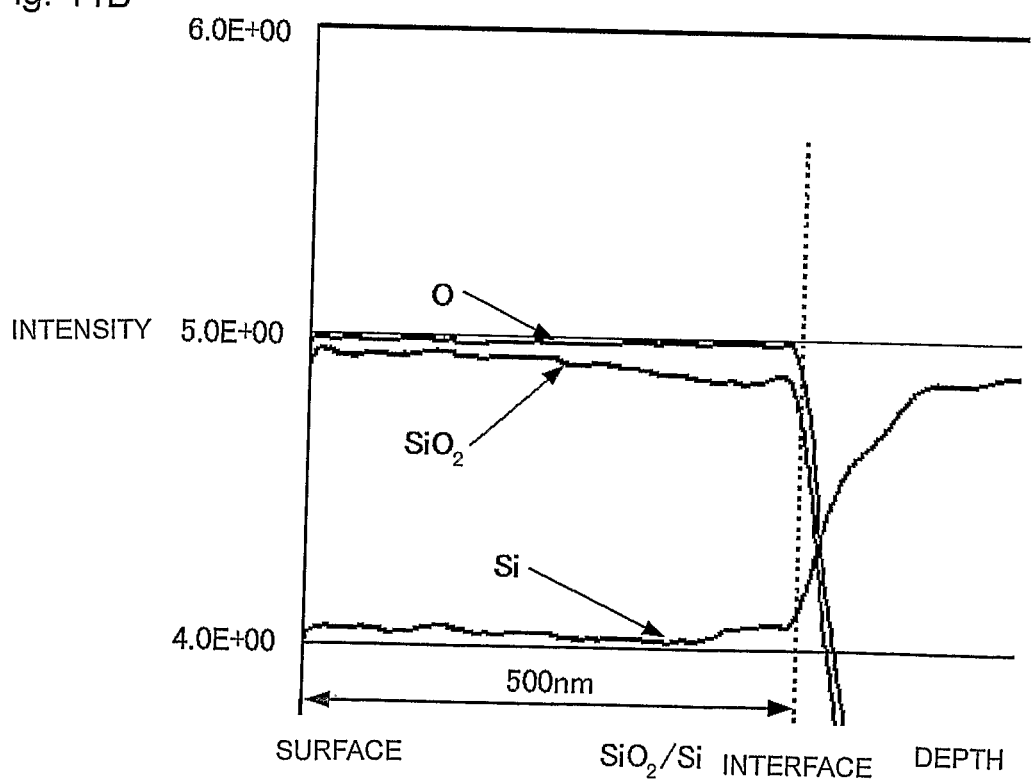
FIG. 11B is a view showing characteristics of a thermal oxide film formed by a thermal CVD method as a comparative object and showing a composition ratio of a film quality.

FIG. 11 shows a result obtained by examining a composition ratio of the silicon oxide film formed on the silicon substrate in a film thickness direction, by a TOF-SIMS (Time-of-flight secondary ion mass spectrometry). FIG. 11a shows the silicon oxide film according to the present invention, and FIG. 11b shows the thermal oxide film formed by the thermal CVD method for comparison. According to the thickness of the deposited film, the silicon oxide film is 400 nm in thickness and the thermal oxide film is 500 nm in thickness.

It can be seen from FIG. 11a that in the silicon oxide film (SixOy) formed by the RLSA microwave plasma, its composition ratio (x:y) is almost constant (x:y=1:2) from the substrate side (interface with the silicon substrate) to an uppermost surface (surface). The composition ratio in the thickness direction is almost the same at any part of the film, and its variation is less than 3%. Thus, since the film has the constant composition ratio in the thickness direction, the film can be regarded as a good film. Meanwhile, according to the thermal oxide film shown in FIG. 11b, silicon is scarce on the side of the substrate (interface) and silicon is increased toward its uppermost surface (surface). Therefore, the ratio between silicon and oxygen differs in a depth direction, and the ratio between silicon and oxygen is different between the substrate side (interface) and the uppermost surface (surface).

Figure 12:
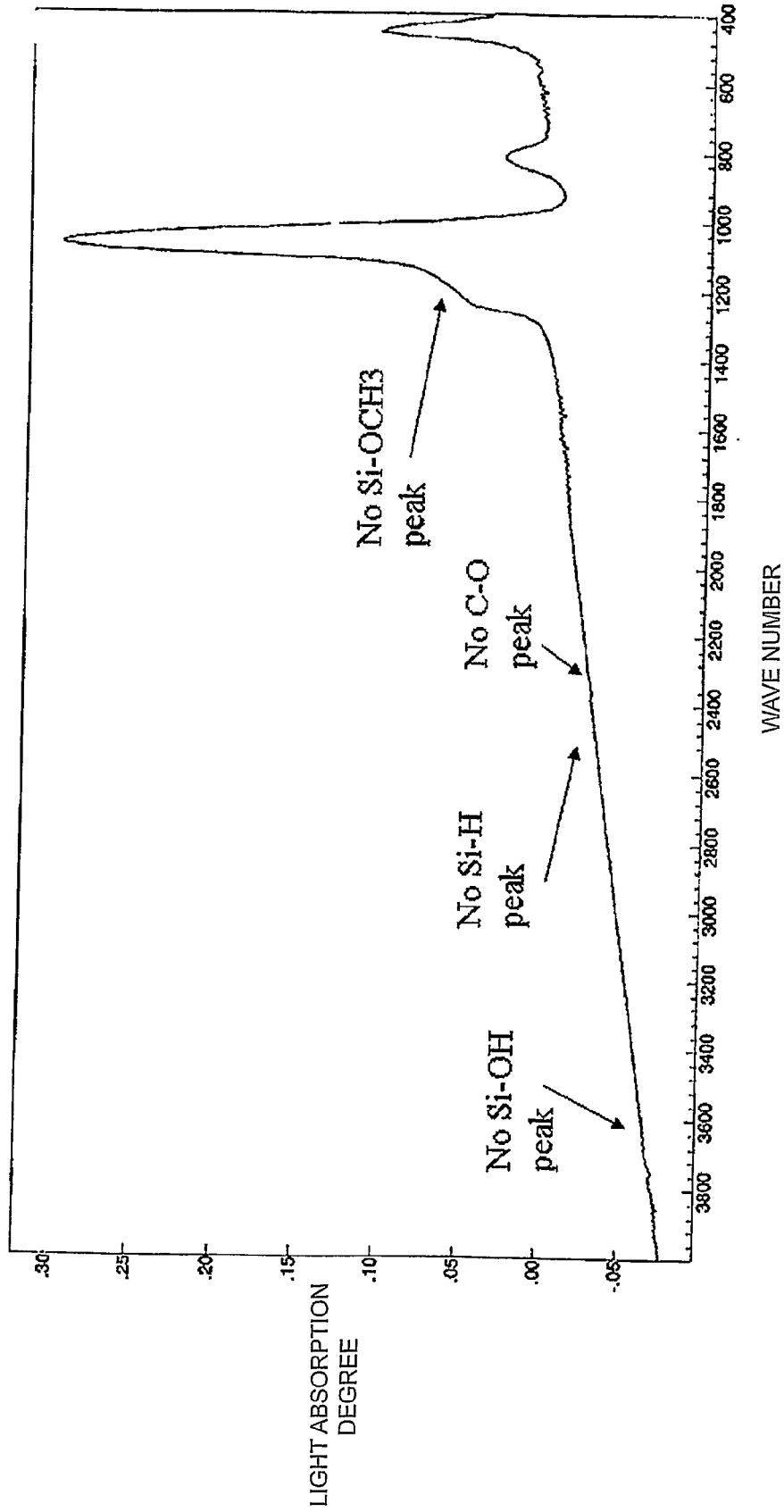
FIG. 12 is a view showing characteristics of the silicon oxide film according to the first embodiment of the present invention and showing a composition of the film quality.

Furthermore, the characteristics of the film are analyzed by the FT-IR. This result is shown in FIG. 12.

According to FIG. 12, SiOH, SiH, CO, Si—CH$_3$ are not measured and each content rate is below the measurable limit. This shows that the above components are substantially not contained. Thus, it can be known that the silicon oxide film may not have contracting feature due to degassing in the processing and does not negatively affect a transistor element due to a methyl group remained in the film.

When an element isolation region is formed in an LSI production step, and a sidewall is formed in a gate forming step, an especially high-quality insulating film (including a gate thermal oxide film) is necessary. The high-quality film here is defined as being superior in insulation withstand voltage and leak characteristics, and reliability characteristics (Qbd life reliability test) due to electric stress of the insulating film. One criterion, for example, is determined by being compared with a HTO film (High Temperature Oxide CVD film) that is formed at high temperature of 800° C. in a furnace type of CVD apparatus and may be regarded as a film having a best film quality among the insulating films formed by the CVD method. In order to form a better CVD film, methods for improving the film quality of the low-temperature CVD film with various processing techniques have been tried, however, a method for forming a low-temperature CVD film at 450° C. or less that has a quality superior to the film quality of the above HTO film has not be put to practical use even with any of the conventional techniques. Although a method for improving a film quality in which a CVD film having a low film quality is subjected to a high-temperature heat treatment later to improve its film quality is widely used, after the CVD film is formed on a target sample substrate at low temperature, it is damaged by heat later in this case.

According to the present embodiment, a film with good quality can be formed even at 450° C. or less at high rate compared with HTO film. The film quality is comparable to the conventional thermal oxide film. Therefore, a high-quality silicon oxide film can be formed even on the target substrate W on which a metal wiring (a part formed of metal such as a metal gate may be contained) has been formed. Furthermore, an ion implanted active layer may not to be damaged and improper thermal diffusion can be prevented. In the case where the low-melting point metal material is previously formed on a base substrate, the processing temperature is preferably further lowered to be not more than 400° C.

Evaluation of the characteristics of the silicon oxide film shows the film having the performance either equaling or surpassing that of the conventional thermal oxide film can be formed in the film forming method of the silicon oxide film of the present embodiment. According to the silicon oxide film formed by the film forming method of the present embodiment, the film is uniform, there is almost no impurity, and the electric characteristics such as the withstand voltage and leak characteristics are excellent.

In addition, when the silicon oxide film is formed, it is not necessary to set the temperature of the target substrate W to high temperature, and the process can be performed at relatively low temperature (450° C. or less). Therefore, even when the metal wiring is provided on the target substrate W, the silicon oxide film superior in withstand voltage and leak characteristics can be formed.

(Second Embodiment)

Figure 13:
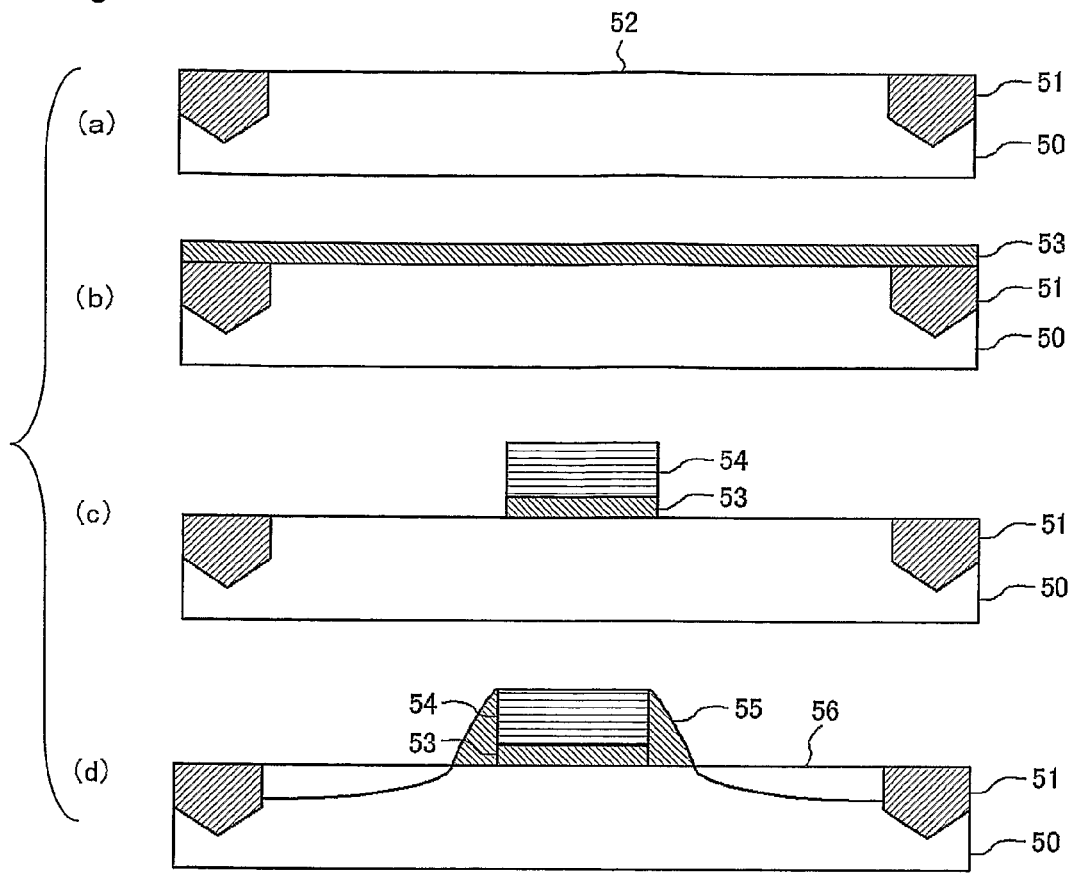

FIG. 13 is a sectional view showing a semiconductor device according to a second embodiment of the present invention. A description will be made of a production example of an MOS type semiconductor device in which the film forming method of the silicon oxide film according to the first embodiment is used, with reference to the drawing. The film is formed with the RLSA microwave plasma in the plasma processing apparatus shown in FIG. 1. In addition, a Si substrate 50 is a P-type semiconductor substrate.

First, the Si substrate 50 in which an element isolation region 51 is formed is prepared (FIG. 13A). At this time, a transistor formation part 52 on a main surface of the Si substrate 50 is formed of Si, SiON, SiO and the like.

Then, as described above for the film forming method of the silicon oxide film in the first embodiment, a gate insulating film 53 composed of the silicon oxide film is formed with TEOS (tetraethoxysilane) by the plasma CVD method (FIG. 13B).

More specifically, the gasses to be used in forming the silicon oxide film are the oxygen gas and the argon gas in addition to the TEOS gas. The partial pressure ratio of the argon gas when the plasma is formed is set to be not less than 40% but not more than 75% of the total gas pressure of the rare gas, the TEOS gas, and the oxygen gas. The flow ratio of the oxygen gas/silicon compound gas is adjusted to be not less than 4.0 but not more than 6.0. In addition, the pressure in the plasma processing chamber to generate the plasma is set at a predetermined pressure that is not less than 6.67 Pa but not more than 133.32 Pa.

Then, a gate electrode 54 is formed on the gate insulating film 53 according to an ordinary method (FIG. 13C). That is, a film of a gate electrode material such as polysilicon is formed on the whole surface by CVD and then, plasma etching is performed through a mask of a resist film patterned by photolithography, whereby the gate electrode 54 is formed. Then, a sidewall oxide film 55 is formed and an impurity diffusion region 56 is formed by ion implantation and the like (FIG. 13D), whereby the MOS type semiconductor device is provided.

Here, while the transistor formation part 52 on the main surface of the Si substrate 50 is formed of Si, SiOn, SiO and the like, a metal wiring of copper and aluminum (Al) may be provided. The silicon oxide film can be formed at a temperature of 450° C. or less.

According to the present embodiment, even when the semiconductor device has the metal wiring, the thin film can be formed of silicon oxide having superior properties under the low temperature condition. As compared with the conventional thermal oxide film, the composition ratio of silicon and oxide is almost constant in the thickness direction, there is almost no impurity contained, and characteristics such as the leak characteristics are equal or more. According to the present embodiment, since the film can be formed at low temperature, the substrate may have the metal wiring, and the design process of the semiconductor device can be expanded as well as the semiconductor device provides better performance.

Although the plasma processing apparatus has the gas inlet on the wall side of the processing chamber in the plasma processing apparatus in the above embodiment, the plasma processing apparatus may have a top plate functioning as a shower plate having gas nozzles over the whole top plate, or have a shower plate at a lower stage. Preferably, the plasma processing apparatus can generate the plasma uniformly just under the whole of the top plate (dielectric window), and can deposit the thin film uniformly in the plasma diffusion region. As to the top plate and the slot shape of the antenna in the plasma processing apparatus, the ones shown in the above are only one example and they are not limited to the above.

In addition, the conditions in forming the film described in the above embodiment, such as the kind of gas, the substrate temperature, and the thickness of the film can be optionally set according to the semiconductor device. In addition, the silicon oxide film can be optionally selected based on a used part and the purpose of the semiconductor device, as the gate oxide film and the liner.

Figure 14:
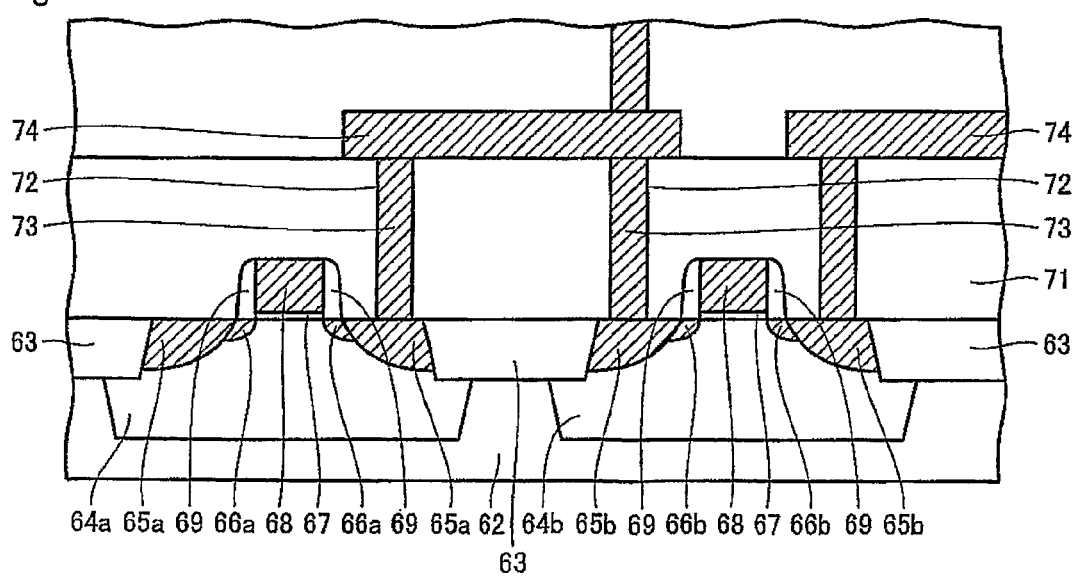
FIG. 14 is a sectional view showing a part of a MOS type semiconductor device.

Here, a description will be made of a case where the silicon oxide film is formed as the liner in an element isolation region (shallow trench isolation). FIG. 14 is a sectional view showing a part of the MOS type semiconductor device. In addition, a conductive layer is hatched in the MOS type semiconductor device shown in FIG. 14.

With reference to FIG. 14, a MOS type semiconductor device 61 is composed of an element isolation region 63, a p-type well 64a, an n-type well 64b, a high-concentration n-type impurity diffusion region 65a, a high-concentration p-type impurity diffusion region 65b, an n-type impurity diffusion region 66a, a p-type impurity diffusion region 66b, and a gate oxide film 67 formed on a silicon substrate 62. Either one pair of the high-concentration n-type impurity diffusion regions 65a or the high-concentration p-type impurity diffusion regions 65b formed so as to sandwich the gate oxide film 67 becomes a drain and the other becomes a source.

In addition, a gate electrode 68 serving as a conductive layer is formed on the gate oxide film 67, and a gate sidewall part 69 serving as an insulating film is formed on the side of the gate electrode 68. In addition, an insulating film 71 is formed on the silicon substrate 62 on which the above gate electrode 68 and the like are formed. A contact hole 72 is formed in the insulating film 71 so as to be connected to the high-concentration n-type impurity diffusion region 65a and the high-concentration p-type impurity diffusion region 65b, and a filler electrode 73 is formed in the contact hole 72. In addition, a metal wiring layer 74 serving as a conductive layer is formed thereon. Furthermore, an interlayer insulating film (not shown) serving as an insulating film and a metal wiring layer serving as a conductive layer are alternately formed, and a pad (not shown) serving as a contact point with an external part is formed finally. Thus, the MOS type semiconductor device 61 is formed.

Figure 15:
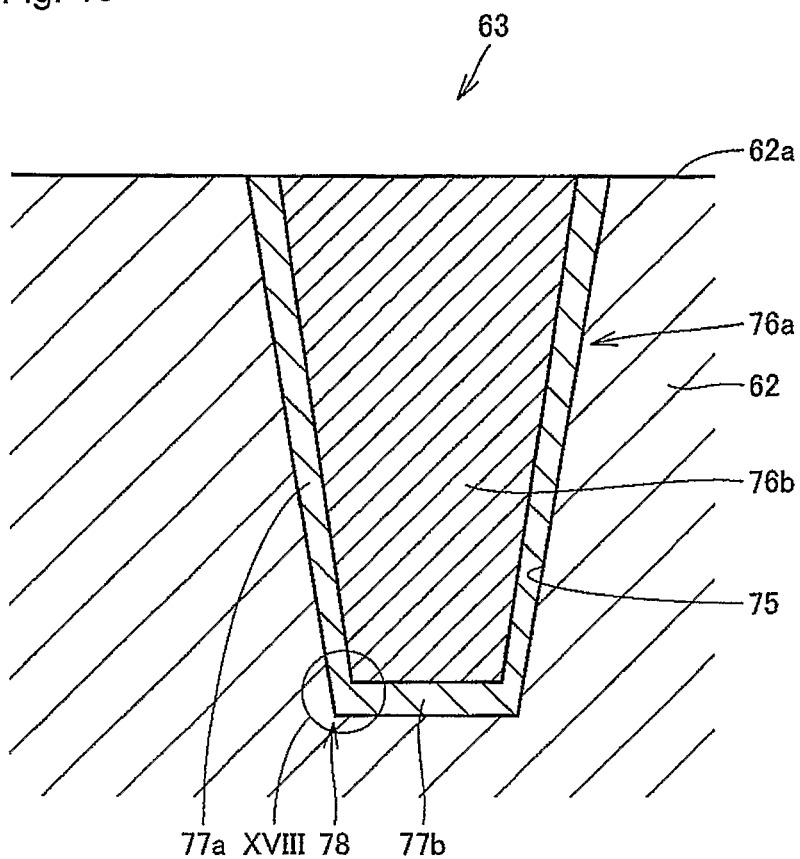
FIG. 15 is an enlarged sectional view showing vicinity of an element isolation region.

In the element isolation region 63, a groove called a trench is recessed downward from the main surface of the silicon substrate 62, and the trench is filled with a member having insulation properties. FIG. 15 is an enlarged sectional view showing the vicinity of the element isolation region 63.

According to specific steps of forming the element isolation region 63, a main surface 62a of the silicon substrate 62 is oxidized to form a $SiO_2$ film first, and a SiN film to be needed in a subsequent CMP (Chemical Mechanical Polishing) step is formed thereon by CVD. Then, a pattern is formed by applying, exposing and developing a photoresist, and with this as a mask, SiN, $SiO_2$, and Si are etched in this order. Thus, the trench 75 is recessed downward from the main surface 62a of the silicon substrate 62 at a predetermined position. Then, the trench 75 is filled with the member having the insulation properties. Thus, the element isolation region 63 is formed.

In this case, in order to enhance the insulation properties of an interface, that is, a boundary surface between the silicon substrate 62 and the insulator in the trench 75, an insulating silicon oxide layer called a liner film 76a is formed on the surface of the trench 75 first. Then, the trench 75 is filled with the insulating filler film 76b. The filler film 76b is formed by a SOD (Spin On dielectric) method or a HDP (High Density Plasma) CVD.

In addition, when high coverage is required, the liner film 76a having high trench filling characteristics may be thickly deposited and then the filler film 76b may be formed, or the filler film 76b may be formed by the same step as that of the liner film 76a.

Here, the liner film 76a needs to be high insulation properties. More specifically, the film quality needs to be superior in electric characteristics such as the withstand voltage and leak characteristics. Conventionally, the oxide film having the above film quality is formed by the thermal oxidation method in general.

This will be described specifically. Since the step of forming the element isolation region is performed prior to the step of forming a gate oxide film of the transistor conventionally in general, the thermal processing temperature is not limited in the STI filling step, that is, the liner film forming step, and the trench filling step performed after the liner film forming step. In other words, even when the high temperature processing is performed in the STI filling step, the gate oxide film is not affected by it. In fact, since the p-type well 64*a* and the n-type well 64*b* have to be formed after the STI filling step, a high-temperature thermal treatment is carried out at about 900° C. in general in order to activate the implanted ion by lamp annealing. More specifically, since the gate oxide film forming step is performed after the STI forming step in producing a normal LSI (large Scale Integrated Circuit), the problem of the thermal processing temperature is not generated in the production process.

However, according to a manufacturing process of a certain flash EEPROM (Electrically Erasable Programmable Read-Only Memory), the STI filling step is performed after the gate oxide film forming step in some cases. More specifically, the step of forming the STI is performed after a step of forming a floating gate contained in the flash EEPROM, or a step of forming the floating gate and a control gate in some cases. In this case, the problem of the thermal processing temperature is generated in the production process.

Figure 16:
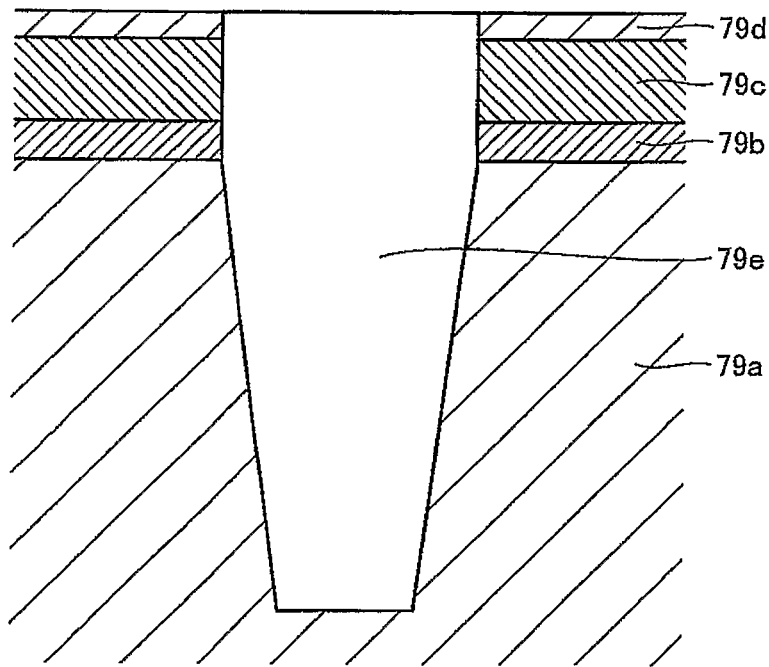
FIG. 16 is an enlarged sectional view showing vicinity of an element isolation region in an EEPROM in which a trench is formed.
Figure 17:
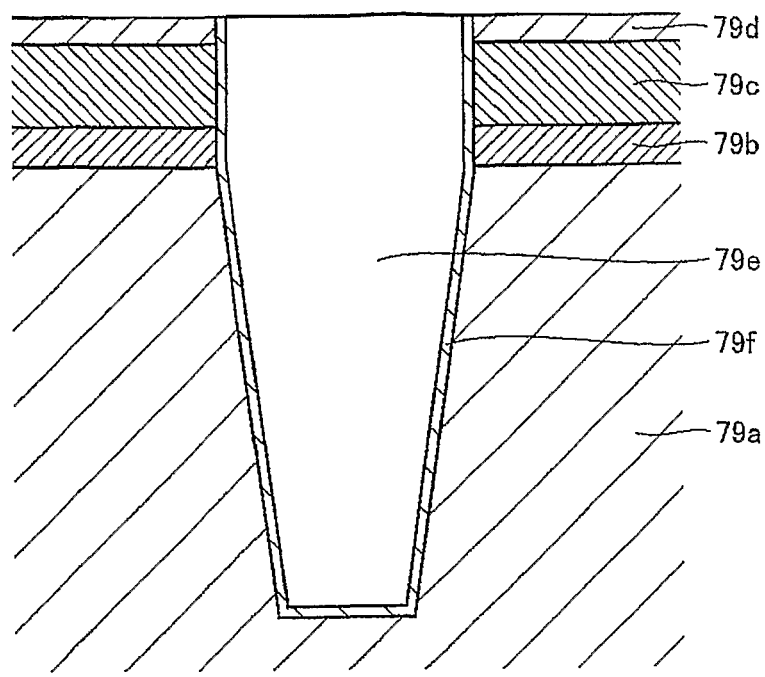
FIG. 17 is an enlarged sectional view showing vicinity of an element isolation region in an EEPROM in which a liner film is formed.

FIG. 16 is a view showing a case where a floating gate is formed on a target substrate and then a trench is formed. With reference to FIG. 16, a layer 79*b* of a silicon oxide film serving as a gate oxide film later is formed on a silicon substrate 79*a* serving as a target substrate, and then a layer 79*c* serving as the floating gate is formed thereon. Then, a layer 79*d* of a silicon oxide film serving as a gate oxide film is formed on the floating gate layer 79*c*, and then a trench 79*e* is formed by etching. Then, as shown in FIG. 17, a liner film 79*f* composed of a silicon oxide film is formed so as to cover the surface of the trench 79*e* in a CVD apparatus. Then, the trench 79*e* is filled. Thus, an element isolation region is formed. In addition, the same is true in the case where a control gate is formed, that is, where the layer 79*c* serving as the floating gate is formed, the silicon oxide film layer 79*d* serving as the gate oxide film is formed thereon, a layer serving as the control gate is formed, an insulation layer is formed thereon, and then the trench is formed by etching.

The above manufacturing steps in which the layer 79*c* serving as the floating gate and the layer serving as the control gate are formed and then the trench 79*e* is formed by etching them collectively have the advantage that self-alignment in photolithography is improved. In view of recent element miniaturization, since such alignment error is required to be as small as possible, the element isolation region is formed in the above order in some cases.

However, according to the above forming steps, the problem of the thermal processing temperature is generated in the production process. In other words, according to the order of the steps in which the liner film is formed after the gate oxide film is formed, since the target substrate is heated to be about as high as 900° C. in the step of forming the liner film by thermal oxidization, the already formed gate oxide films provided under and above the floating gate are affected by the thermal oxidation at high temperature. More specifically, the ends of the layers 79*b* and 79*d* as the gate oxide films in the element isolation region are abnormally oxidized, and the problems is that the lateral width of the gate oxide film is increased.

In addition, according to the above conventional thermal oxidation at high temperature in forming the liner film, since it is necessary to heat the whole substrate to high temperature such as 700° C. or more, the problem that the metal with low melting point is melted arises not only in the case of the step of forming the EEPROM shown in FIGS. 16 and 17, but also in the case where a metal wiring layer of the semiconductor device has been already formed of metal having a low melting point. Thus, the order of the steps of forming the liner film is limited. More specifically, the step of forming the liner film has to be performed before the step of forming the metal wiring layer. Such limit of the order of the forming steps becomes disincentive in selecting the production process of the semiconductor device required to have high performance at the present. For example, when the gate electrode is replaced with polysilicon to improve the performance of the gate electrode, and a metal with low melting point is used, the step using such metal has to be performed after forming the liner film.

In addition, when a parallel plate type plasma and the like is used in the step of forming the above liner film, since plasma has a high electron temperature, the silicon substrate is damaged by plasma. In addition, since many impurities such as SiOH are taken in the silicon oxide film during the film formation, a film having high insulation performance like the thermal oxide film cannot be provided.

Here, the liner film 76*a* is formed in the element isolation region as follows. First, gases containing a silicon compound gas, an oxidizing gas, and a rare gas are supplied to the processing chamber. Here, according to the gasses containing the silicon compound gas, the oxidizing gas, and the rare gas, it is noted that the partial pressure ratio of the rare gas is 10% or more of the total gas pressure of the silicon compound gas, the oxidizing gas, and the rare gas, and the effective flow ratio of the silicon compound gas and the oxidizing gas (oxidizing gas/silicon compound gas) is not less than 3 but not more than 11. Thus, with the plasma generated by the microwave supplied into the processing chamber, under the condition that the target substrate in which the trench is formed is set at 450° C. or less, the liner film composed of the silicon oxide film is formed on the surface of the trench. More specifically, the TEOS gas is used as the silicon compound gas, the oxygen gas is used as the oxidizing gas, and the argon gas is used as the rare gas. In addition, the microwave may be introduced after the gasses are introduced or before the gasses are introduced.

More specifically, the method for forming the liner film 76*a* in the element isolation region 63 includes the step of supplying the processing gasses containing the silicon compound gas, the oxidizing gas, and the rare gas in which the partial pressure ratio of the rare gas is 10% or more of the total gas pressure of the silicon compound gas, the oxidizing gas, and the rare gas, and the effective flow ratio of the silicon compound gas and the oxidizing gas (oxidizing gas/silicon compound gas) is not less than 3 but not more than 11, to the plasma processing chamber, and the step of forming the liner film composed of the silicon oxide film on the surface of the trench with the plasma generated by the microwave supplied into the plasma processing chamber under the condition that the target substrate in which the trench is formed is set at 450° C. or less.

According to the above method, since the liner film is formed in the element isolation region by the plasma processing with the microwave plasma, when the liner film is formed in the element isolation region, the plasma damage is not applied to the silicon substrate. In addition, the film quality of the liner film formed as described above is superior to that of the film formed by the thermal oxidation, in electric characteristics and the like, as shown in FIG. 10.

In addition, since the liner film can be formed at low temperature, even when the gate oxide film has been already formed, the end of the formed gate oxide film is not abnormally oxidized. In addition, the problem that the low melting point metal is melted is avoided. Thus, the liner film can be formed after the metal processing. In other words, since the order of the step of forming the liner film is not limited, the degree of freedom of the order of the steps of the manufacturing process of the semiconductor device can be increased, so that the manufacturing process can be selected more flexibly. More specifically, the liner film can be formed by the above method for forming the liner film after the MOS transistor has been formed, and then, the trench is filled, whereby the STI serving as the element isolation region can be formed.

In addition, since the manufacturing method of the semiconductor device according to the present embodiment includes the step of forming the element on the target substrate, and the step of forming the liner film by the above method for forming the liner film after forming the element, the electric characteristics are excellent.

Figure 18:
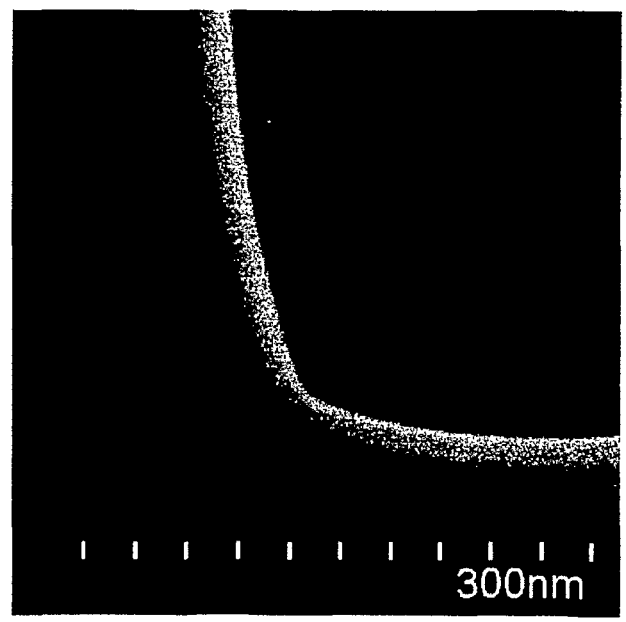
FIG. 18 is a electron microscope photograph showing a corner part of the trench shown by XVIII in FIG. 15.

Here, it is preferable that the plasma processing is performed before the liner film is formed. More specifically, the method for forming the liner film 76a in the element isolation region 63 includes a step of performing the plasma processing on the surface of the trench for the target substrate in which the trench has been formed, before the step of forming the liner film. Thus, a "rounding effect" at a corner part can be achieved. That is, referring to FIG. 15 again, due to the step of the plasma processing in which there is no dependency on surface orientation, the liner film at a corner part 78 between a sidewall part 77a of the trench 75 and a bottom part 77b of the trench 75 can be rounded. More specifically, since there is no sharp part from the sidewall part 77a to the bottom part 77b, the liner film can be formed so as to be smoothly connected from the sidewall part to the bottom part 77b. When the corner part 78 of the liner film is rounded, the concentrated electric field is prevented from concentrating on this part. In addition, FIG. 18 shows an electron microscope photograph showing the corner part 78 of the trench 75 at a part XVIII in FIG. 15.

In addition, the method for forming the liner film 76a in the element isolation region 63 may include a step of performing the plasma processing on the surface of the liner film after the step of forming the liner film. In this case, the formed liner film has small number of impurities such as SiOH. Such film is superior in insulation properties in the electric characteristics.

Here, while the processing temperature can be 450° C. or less, when the temperature is further lowered to 300° C., for example, it is further preferable that the plasma processing is performed after the silicon oxide film has been formed. More specifically, the method for forming the liner film in the element isolation region includes the step of supplying the processing gasses containing the silicon compound gas, the oxidizing gas, and the rare gas in which the partial pressure ratio of the rare gas is 10% or more of the total gas pressure of the silicon compound gas, the oxidizing gas, and the rare gas, and the effective flow ratio of the silicon compound gas and the oxidizing gas (oxidizing gas/silicon compound gas) is not less than 3 but not more than 11, to the plasma processing chamber, the step of forming the liner film composed of the silicon oxide film on the surface of the trench with the plasma generated by the microwave supplied into the plasma processing chamber under the condition that the target substrate in which the trench is formed is set at 300° C. or less, and the step of performing the plasma processing on the surface of the liner film after the step of forming the liner film. Thus, the film having less impurities such as SiOH can be formed at 300° C. or less. In addition, in this case also, the method for forming the liner film in the element isolation region may include the step of performing the plasma processing on the surface of the trench for the target substrate in which the trench has been formed before the step of forming the liner film. Thus, since the "rounding effect" as described above can be achieved, the electric field can be prevented from concentrating on the corner part, so that abnormal discharge can be effectively prevented.

In addition, according to the method for forming the liner film, the plurality of processing steps can be performed in series by changing the gasses to be supplied in the same processing chamber. More specifically, by supplying the processing gasses containing the oxygen gas and the argon gas, the plasma processing is performed on the surface of the trench with the microwave plasma, and then by supplying the TEOS gas into the processing chamber sequentially keeping the plasma, the liner film composed of the silicon oxide film is formed by the plasma CVD. In addition, after the liner film has been formed of the silicon oxide film with the TEOS gas, the oxygen gas, and the argon gas by the plasma CVD, the TEOS gas supply is stopped and the supply amount of the oxygen gas is increased while the oxygen gas and the argon gas are supplied, whereby the plasma processing can be performed on the liner film. Thus, performing the plurality of processing in series is considerably advantageous in view of throughput cost in the manufacturing process.

Figure 19:
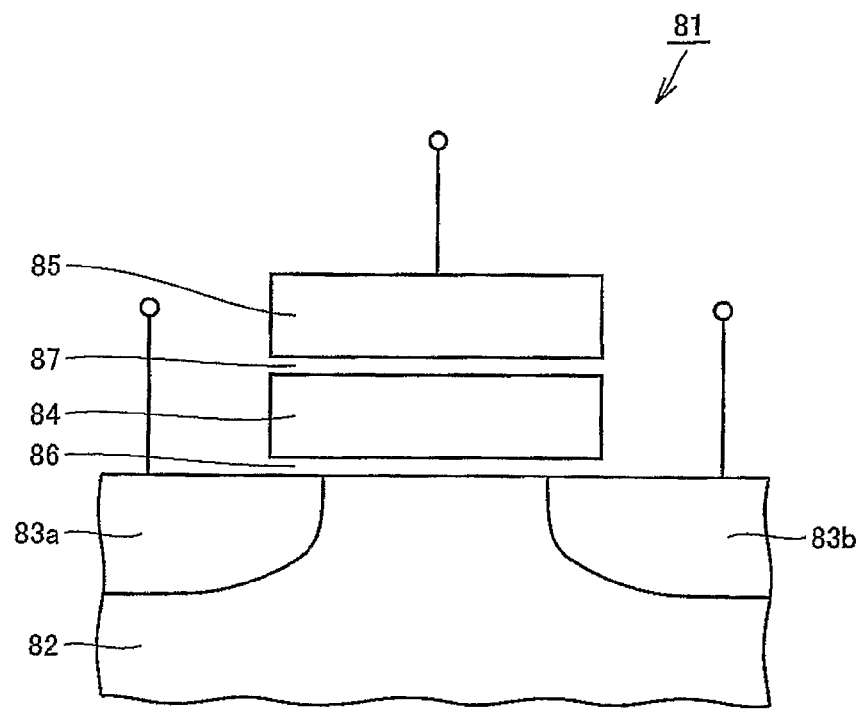
FIG. 19 is a sectional view schematically showing a part of a flash memory.

The silicon oxide film described above can be applied when a gate oxide film is formed in a flash memory. FIG. 19 is a sectional view schematically showing a part of the flash memory. First, referring to FIG. 19, a flash memory 81 includes a source 83a, a drain 83b, a floating gate 84, and a control gate 85 formed on a silicon substrate 82. In addition, a gate oxide film 86 is formed as a first insulation layer, between the floating gate 84 and the silicon substrate 82, and a gate oxide film 87 is formed as a second insulating layer, between the floating gate 94 and the control gate 95.

A manufacturing method of the above flash memory 81 above will be briefly described. First, the first insulating layer serving as the gate oxide film 86 is formed on a main surface of the silicon substrate 82 serving as a target substrate, and the layer serving as the floating gate 84 is formed on the first insulating layer. Then, the second insulating layer serving as the gate oxide film 87 is formed on the layer serving as the floating gate 84, and the layer serving as the control gate 85 is formed on the second insulating layer. Here, the gate oxide film 87 provided between the floating gate 84 and the control gate 85 is formed by the following method. First, gasses containing a silicon compound gas, an oxidizing gas, and a rare gas are supplied into a processing chamber. Here, as to the gasses containing the silicon compound gas, the oxidizing gas, and the rare gas, it is to be noted that a partial pressure ratio of the rare gas is 10% or more of a total gas pressure of the silicon compound gas, the oxidizing gas, and the rare gas, and an effective flow ratio of the silicon compound gas and the oxidizing gas (oxidizing gas/silicon compound gas) is not less than 3 but not more than 11. Thus, with plasma generated by a microwave supplied into the processing chamber, the gate oxide film 87 serving as the second insulating layer composed of the silicon oxide film is formed on the surface of a trench, under the condition that the target substrate in which the trench is formed is set at 450° C. or less.

The gate oxide film 87 formed as described above has considerably excellent electric characteristics as described above. In addition, it can be formed at low temperature and has an advantage in view of the free degree of manufacturing process. Similarly, the gate oxide film 86 serving as the first insulating layer, and a gate oxide film serving as an insulating layer to be formed on the control gate 85 may be produced by the same method.

Figure 20:
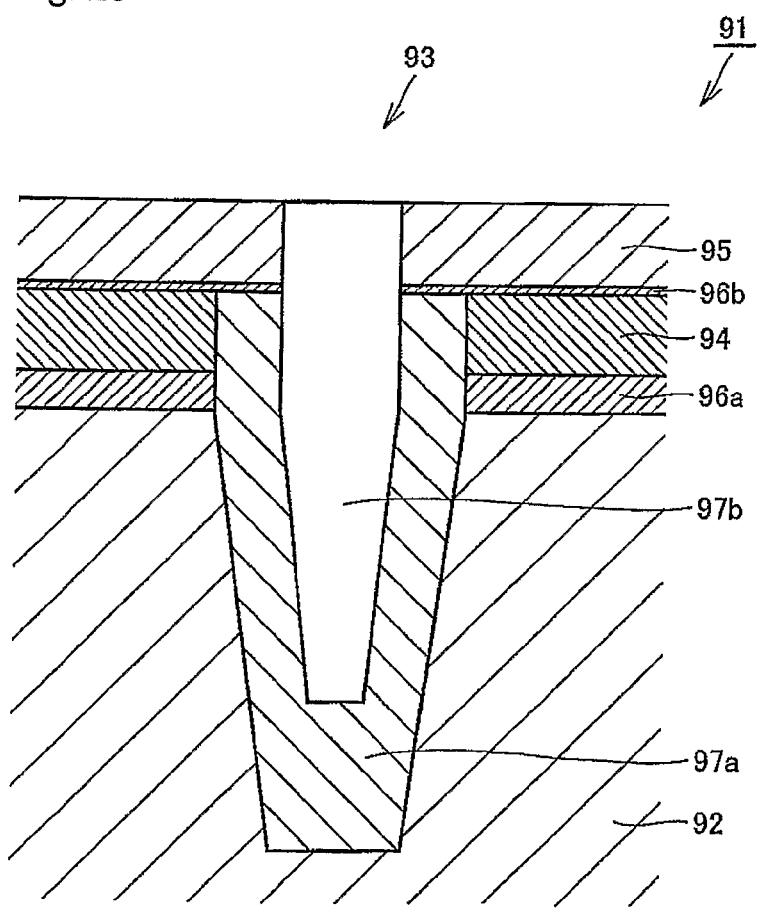
FIG. 20 is an enlarged sectional view showing vicinity of an element isolation region.

In addition, a trench may be further provided in the filled trench, in the element isolation region shown in FIG. 15. FIG. 20 is an enlarged sectional view showing the vicinity of the element isolation region in this case. Referring to FIG. 20, an MOS type semiconductor device 91 includes a silicon substrate 92, an element isolation region 93 formed by filling a first trench 97a, a floating gate 94, a control gate 95, and first and second gate oxide films 96a and 96b. A second trench 97b is provided by forming a filling layer of the first trench 97a in the element isolation region.

The above silicon oxide film is also formed in the MOS type semiconductor device 91. That is, the first and second gate oxide films, and the liner film provided on the surfaces of the first and second trenches 97a and 97b are formed by the above method. Thus, the oxide film has preferable electric characteristics.

In addition, the point of this technique lies in the fact that the high quality CVD film can be formed at low temperature with the aid of plasma energy by use of an advantage of low damage plasma of the microwave RLSA plasma. Thus, the development in a CVD film forming technique implemented at lower temperature such as 300° C. or less can be readily expected based on the present invention technique. This technique can be readily applied to the case where a film is formed on a substrate containing an organic material that is easily affected by heat.

Industrial Applicability

A film forming method of a silicon oxide film, a silicon oxide film, a semiconductor device, and a production method of a silicon oxide film according to the present invention can be effectively applied to a case where a thin film composed of silicon oxide having a superior quality is required to be formed by a low-temperature CVD method.

The invention claimed is:

1. A film forming method of a silicon oxide film comprising:
   a step of supplying processing gasses containing a silicon compound gas, an oxidizing gas, and a rare gas, in which a partial pressure ratio of said rare gas is not less than 40% but not more than 75% of a total gas pressure of said silicon compound gas, said oxidizing gas, and said rare gas, and an effective flow ratio of said silicon compound gas and said oxidizing gas (oxidizing gas/silicon compound gas) is not less than 3 but not more than 11, to a plasma processing chamber;
   a step of supplying a microwave into said plasma processing chamber; and
   a step of forming a silicon oxide film on a target substrate with plasma generated by said microwave.

2. The film forming method of the silicon oxide film according to claim 1, wherein said silicon compound gas is a silicon compound gas containing Si—O—R (alkoxide group).

3. The film forming method of the silicon oxide film according to claim 2, wherein said silicon compound gas is a TEOS (tetraethoxysilane) gas.

4. The film forming method of the silicon oxide film according to claim 1, wherein said silicon compound gas is a silane (silicon hydride) gas having a silicon atom and/or a silicon compound gas containing a silane compound.

5. The film forming method of the silicon oxide film according to claim 1, wherein said oxidizing gas contains an oxygen gas.

6. The film forming method of the silicon oxide film according to claim 1, wherein said oxidizing gas contains an ozone gas.

7. The film forming method of the silicon oxide film according to claim 1, wherein said plasma is generated by a microwave emitted from a slot antenna.

8. The film forming method of the silicon oxide film according to claim 1, wherein said effective flow ratio (oxidizing gas/silicon compound gas) is not less than 4.0 but not more than 6.0.

9. A film forming method of a silicon oxide film comprising:
   a step of supplying processing gasses containing a TEOS (tetraethoxysilane) gas, an oxygen gas, and an Ar (argon) gas, in which a partial pressure ratio of said Ar gas is not less than 40% but not more than 75% of a total gas pressure of said TEOS gas, said oxygen gas, and said Ar gas, and an effective flow ratio of said TEOS gas and said oxygen gas (oxygen gas/TEOS gas) is not less than 3 but not more than 11, to a plasma processing chamber;
   a step of supplying a microwave into said plasma processing chamber through a slot; and
   a step of forming a silicon oxide film on a target substrate with plasma generated by said microwave.

10. The film forming method of the silicon oxide film according to claim 9, wherein said effective flow ratio (oxygen gas/TEOS gas) is not less than 4.0 but not more than 6.0.

11. The film forming method of the silicon oxide film according to claim 1, wherein a temperature of said target substrate is set to be not more than 450° C.

12. The film forming method of the silicon oxide film according to claim 1, wherein a temperature of said target substrate is set to be not less than 360° C. but not more than 390° C.

13. The film forming method of the silicon oxide film according to claim 1, wherein a pressure in said plasma processing chamber is set to be not less than 6.67 Pa but not more than 133.32 Pa.

14. A silicon oxide film formed by the film forming method according to claim 1.

15. A semiconductor device comprising the silicon oxide film according to claim 14.

16. A semiconductor device having a metal material containing a low melting point metal brought to be changed in composition due to a heat treatment at 450° C. or more on a target substrate, and comprising the silicon oxide film according to claim 14.

17. The semiconductor device according to claim 16, wherein said metal material is Cu (copper) or Al (aluminum).

18. A manufacturing method of a semiconductor device comprising a step of forming the silicon oxide film according to claim 14.

19. A film forming method of a liner film in an element isolation region comprising:
   a step of supplying processing gasses containing a silicon compound gas, an oxidizing gas, and a rare gas, in which a partial pressure ratio of said rare gas is not less than 40% but not more than 75% of a total gas pressure of said silicon compound gas, said oxidizing gas, and said rare gas, and an effective flow ratio of said silicon compound gas and said oxidizing gas (oxidizing gas/silicon compound gas) is not less than 3 but not more than 11, to a plasma processing chamber; and
   a step of forming a liner film composed of a silicon oxide film on a surface of a trench with plasma generated by a microwave supplied into the plasma processing chamber under the condition that a target substrate in which said trench is formed is set to be not more than 450° C.

20. The film forming method of the liner film according to claim 19, comprising a step of performing plasma processing on the surface of said trench, for the target substrate in which said trench is formed before the step of forming said liner film.

21. The film forming method of the liner film according to claim 19, comprising a step of performing plasma processing on the surface of said liner film after the step of forming said liner film.

22. The film forming method of the liner film according to claim 19, wherein said silicon compound gas contains a TEOS gas.

23. The film forming method of the liner film according to claim 19, wherein said oxidizing gas contains an oxygen gas.

24. The film forming method of the liner film according to claim 19, wherein said rare gas contains an argon gas.

25. A film forming method of a liner film in an element isolation region comprising:
- a step of supplying processing gasses containing a silicon compound gas, an oxidizing gas, and a rare gas, in which a partial pressure ratio of said rare gas is not less than 40% but not more than 75% of a total gas pressure of said silicon compound gas, said oxidizing gas, and said rare gas, and an effective flow ratio of said silicon compound gas and said oxidizing gas (oxidizing gas/silicon compound gas) is not less than 3 but not more than 11, to a plasma processing chamber;
- a step of forming a liner film composed of a silicon oxide film on a surface of a trench with plasma generated by a microwave supplied into the plasma processing chamber under the condition that a target substrate in which said trench is formed is set to be not more than 300° C.; and
- a step of performing plasma processing on the surface of said liner film after the step of forming the liner film.

26. The film forming method of the liner film according to claim 25, comprising a step of performing plasma processing on the surface of said trench, for the target substrate in which said trench is formed before the step of forming the liner film.

27. A manufacturing method of a semiconductor device, comprising:
- a step of forming an element on a target substrate; and
- a step of forming a liner film by the film forming method of the liner film according to claim 19 after the step of forming said element.

* * * * *